(12) United States Patent
Poulton et al.

(10) Patent No.: US 7,501,867 B2
(45) Date of Patent: Mar. 10, 2009

(54) POWER SUPPLY NOISE REJECTION IN PLL OR DLL CIRCUITS

(75) Inventors: John Wood Poulton, Chapel Hill, NC (US); Thomas H. Greer, III, Chapel Hill, NC (US)

(73) Assignee: Rambus, Inc., Los Altos, CA (US)

( * ) Notice: Subject to any disclaimer, the term of this patent is extended or adjusted under 35 U.S.C. 154(b) by 143 days.

(21) Appl. No.: 11/520,972

(22) Filed: Sep. 14, 2006

(65) Prior Publication Data

US 2008/0068056 A1   Mar. 20, 2008

(51) Int. Cl.
*H03L 7/06* (2006.01)
(52) U.S. Cl. ...................... 327/156; 327/147
(58) Field of Classification Search ............... None
See application file for complete search history.

(56) References Cited

U.S. PATENT DOCUMENTS

| | | | | |
|---|---|---|---|---|
| 6,016,332 A * | 1/2000 | Smith et al. | | 375/376 |
| 6,351,167 B1 * | 2/2002 | Hein et al. | | 327/158 |
| 6,559,697 B2 * | 5/2003 | Kikuchi | | 327/156 |
| 6,570,456 B2 * | 5/2003 | Mano et al. | | 331/11 |
| 6,600,352 B2 * | 7/2003 | Miyamoto | | 327/161 |
| 6,914,491 B2 * | 7/2005 | Derksen | | 331/17 |
| 6,937,076 B2 * | 8/2005 | Gomm | | 327/158 |
| 6,997,052 B2 * | 2/2006 | Woehrle | | 73/290 V |
| 7,034,588 B2 * | 4/2006 | Cheung et al. | | 327/157 |
| 7,271,619 B2 * | 9/2007 | Kawago et al. | | 326/87 |
| 2004/0251938 A1 * | 12/2004 | Lu | | 327/156 |
| 2006/0044030 A1 * | 3/2006 | Baez et al. | | 327/156 |

* cited by examiner

*Primary Examiner*—Cassandra Cox
(74) *Attorney, Agent, or Firm*—Lerner, David, Littenberg, Krumholz & Mentlik, LLP

(57) ABSTRACT

A phase controller can be part of a phase-locked loop (PLL) or a delay-locked loop (DLL). The phase controller includes first and second regulators. The first regulator provides power supply noise rejection while the second regulator provides phase and frequency lock.

21 Claims, 8 Drawing Sheets

POWER SUPPLY NOISE REJECTION IN PLL OR DLL CIRCUITS

BACKGROUND OF THE INVENTION

This application is directed to a phase-locked loop (PLL) or delay-locked loop (DLL) with high power supply noise rejection and low power operation.

A phase-locked loop (PLL) is a closed-loop feedback control system that generates an output signal and maintains that signal in a fixed phase relationship with a reference signal. A conventional PLL includes a phase detector, a loop filter and a voltage-controlled oscillator (VCO). The VCO generates a periodic output signal having a frequency that is dependent on a control signal. The VCO may initially be brought to the same frequency as the reference signal by means of a separate frequency detector or by means of a combined phase/frequency detector. After frequency lock has been obtained, the phase detector detects phase differences between the output signal and the reference signal and modifies the VCO control signal so as to adjust the output signal to be in a predetermined phase relationship with the reference signal.

A delay-locked loop (DLL) is similar to a PLL, with the VCO being replaced with a voltage-controlled delay line (VCDL). The VCDL receives an input signal and generates an output signal as a time-delayed version of the input signal, the delay of the output signal with respect to the input signal being a function of a control signal.

The VCO or VCDL is coupled to a power supply that supplies its operating current. However, power supply noise, that is, variations in the power supply voltage, may vary the phase of the output signal relative to the reference signal, introducing jitter into the output signal. Thus, it is desirable for the PLL or DLL to reject power supply noise.

DETAILED DESCRIPTION

Figure 1A:
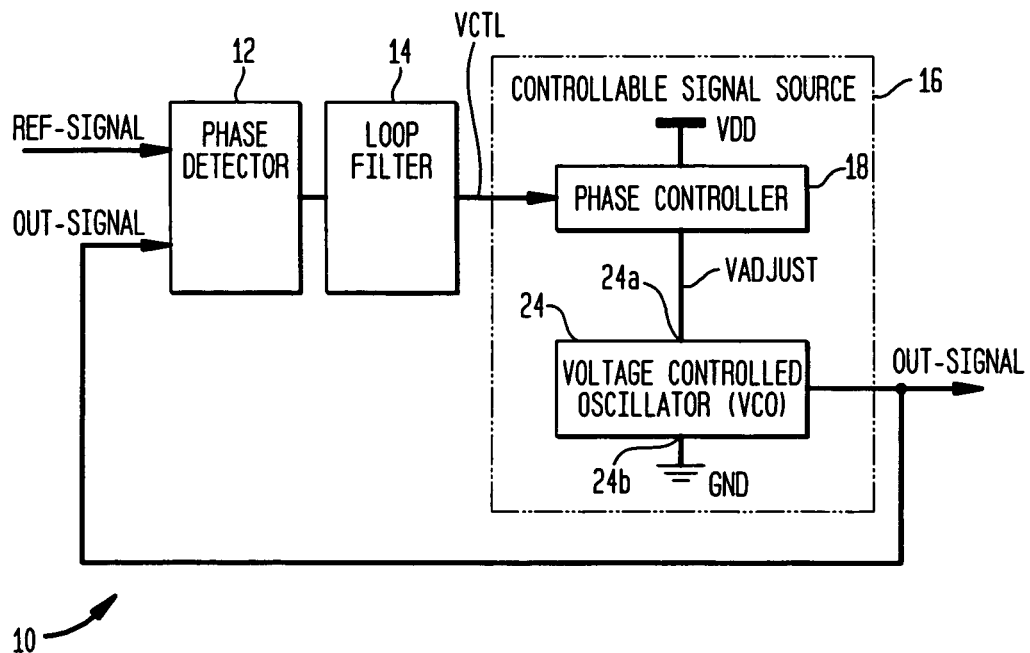
FIG. 1A is a block diagram of a phase-locked loop (PLL) according to an embodiment of the application.

The present application teaches a PLL or a DLL with an improved structure that rejects power supply noise without degrading other aspects of PLL or DLL functions.

A phase control circuit according to one embodiment of the present application includes first and second regulators. The first regulator provides power supply noise rejection while the second regulator provides phase and frequency lock.

In a further embodiment, the phase control circuit includes first and second power supply terminals, and first and second circuit nodes. A signal generator is coupled between the second circuit node and the second power supply terminal, the signal generator to produce a periodic output signal having a signal parameter dependent on a phase adjust voltage at the second circuit node. The signal parameter can be the frequency of the output signal, the phase of the output signal, or the delay of the output signal with respect to an input signal. The first regulator is coupled between the first power supply terminal and the first circuit node, the first regulator to filter noise in a power supply voltage between the first and second power supply terminals away from the signal generator. The second regulator is coupled between the first and second circuit nodes, the second regulator to adjust the phase adjust voltage in response to a control signal, the control signal being dependent on a phase difference between the output signal and a reference signal.

In one embodiment, the first regulator is to change the impedance of a circuit path between the first power supply terminal and the first circuit node in response to a change in the power supply voltage. The first regulator may control the impedance based on a comparison of the control signal with a target signal. The first regulator may thus hold an average of the control signal close to a target value. The first regulator may alternatively control the impedance based on a comparison of a regulated supply voltage at the first circuit node with a target voltage. In one embodiment, a bandwidth or operation speed of the first regulator is about two orders of magnitude below that of the phase control circuit.

In another embodiment, a phase control circuit includes a signal generator to generate an output signal having a phase, a first regulator to generate a phase adjust signal in response to a control signal, and a second regulator to hold an average of the control signal close to a target value. The control signal is dependent on a phase difference between the output signal and a reference signal, and the phase adjust signal controls the phase of the output signal.

In yet another embodiment, a phase control circuit includes first and second regulators, and a signal generator. The signal generator generates an output signal having a signal parameter depending on at least one of a current and a voltage across the signal generator. The signal parameter can be the frequency of the output signal, the phase of the output signal, or the delay of the output signal with respect to an input signal. The first regulator has a first terminal for coupling to a power supply, a second terminal to receive a first control signal, a third terminal to receive a target signal, and a regulated supply terminal to provide a regulated power supply based at least in part on comparison of the first control signal with the target signal. The second regulator is coupled to the regulated supply terminal, is to receive a second control signal, and is to output an adjust signal based at least in part on the second control signal. The adjust signal adjusts at least one of the current and the voltage across the signal generator.

In a further embodiment, the first regulator includes a low pass filter to filter out power supply noise including variations in a voltage between the first and second power supply terminals. The low pass filter may include a transistor coupled between the first power supply terminal and the regulated supply terminal and a capacitor coupled across the regulated supply terminal and the second power supply terminal.

The first control signal may be the same as the second control signal. Alternatively, the first control signal is the same as the regulated power supply.

In one embodiment, the second regulator includes a transistor coupled to the signal generator in a shunt configuration and a resistor coupled to the signal generator in a series configuration. The second regulator may alternatively or additionally include a transistor coupled in series between the regulated supply terminal and the signal generator. Thus, the second regulator may include a combination of shunt and series elements.

The signal generator may be selected from the group consisting of a voltage controlled oscillator and a voltage controlled delay line.

A method of phase control according to one embodiment of the present application includes the steps of: generating an output signal having a phase; receiving a control signal based at least in part on a phase difference between the output signal and a reference signal; generating a regulated power supply based at least in part on comparison between the control signal and a target signal; generating an adjust signal according to the control signal and the regulated power supply; and adjusting the phase of the output signal in accordance with the adjust signal.

A method of phase control according to a further embodiment of the present application includes the steps of: generating a phase adjust signal in response to a control signal; producing an output signal having a phase dependent on the phase adjust signal; generating the control signal based at least in part on a phase difference between the output signal and a reference signal; and holding an average of the control signal close to a target value to filter out noise in a power supply voltage. In one embodiment, the holding step may include controlling an impedance based on a comparison of the control signal with the target value.

The present application also includes an information-bearing medium having computer-readable information thereon, the computer-readable information being configured to actuate a circuit-forming apparatus to form a cell of an integrated circuit including a phase control circuit as described above and further below.

Referring to FIG. 1A, shown is a block diagram of a PLL 10. The PLL 10 is a closed-loop feedback control system that generates an output signal OUT-SIGNAL and maintains the phase of that signal in a fixed relationship to the phase of a reference signal REF-SIGNAL. The reference signal can be a data signal or a periodic clock signal having a phase and frequency. The PLL 10 includes a phase detector 12, a loop filter 14 and a controllable signal source 16 placed in a negative feedback configuration. Phase detector 12 receives REF-SIGNAL on a first input and OUT-SIGNAL on a second input. Optionally a divider (not shown) may be included in the feedback path between OUT-SIGNAL and the second input of phase detector 12. This divider may be a simple divide-by-integer divider or a fractional-N divider, composed in any one of many ways known to those skilled in the art. If a divider is included, the frequency of OUT-SIGNAL may be a multiple (K/N) of the frequency of REF-SIGNAL, where K and N are both integers, and K and/or N may be variable digital inputs to the divider. In one embodiment, the controllable signal source 16 includes a phase controller 18 and a signal generator 24 that outputs the OUT-SIGNAL. The signal generator 24 may include two power supply terminals, the voltage or current between the two power supply terminals controlling the phase of the OUT-SIGNAL. In PLL 10, the signal generator can be a voltage controlled oscillator (VCO). The VCO 24 may be implemented in various ways. In some implementations, the VCO 24 may have a first power supply terminal 24a and a second power supply terminal 24b and a frequency control input. In one embodiment, the first power supply terminal 24a also serves as the frequency control input. The VCO 24 may be implemented in various ways. By way of example, the voltage controlled oscillator 24 may be a ring oscillator, or an oscillator constructed from integrated on-chip inductors or inductors integrated into a chip package, such as bond wires or printed circuit conductors. Referring to FIG. 1A, the first power supply terminal 24a of the VCO 24, which also serves as the frequency control input, is coupled to receive a signal VADJUST from the phase controller 18, which is coupled to a positive common supply VDD, and the second power supply terminal is coupled to a negative common supply GND. Note that these connections are for illustrative purposes only; in other implementations, the common supply terminal GND might be the more positive supply voltage than VDD.

Still referring to FIG. 1A, the controllable signal source 16 generates the output signal OUT-SIGNAL which is controlled to have a fixed phase relationship with the reference or input signal REF-SIGNAL. PLL 10 operates initially to acquire frequency lock, so as to bring output signal OUT-SIGNAL to substantially the same frequency as input REF-SIGNAL, either by using a separate frequency detector (not shown) or by using a combined phase/frequency detector for phase detector 12. Once frequency lock is acquired, if there is a difference in phase between output signal OUT-SIGNAL and the reference signal REF-SIGNAL, the phase detector 12 detects this difference and introduces via loop filter 14 a change in a control signal VCTL, which change is proportional to the difference in phase. Phase controller 18 responds to changes in the control signal VCTL by producing proportional changes in the VADJUST signal, which is sent to the frequency control input 24a of VCO 24 to adjust the frequency of the OUT-SIGNAL. The phase of OUT-SIGNAL, being an integral of the frequency of the OUT-SIGNAL is thus adjusted accordingly. The loop filter 14 may include both high-pass and low-pass elements, and may function to maintain frequency lock by maintaining an average voltage on VCTL while allowing small impulses onto VCTL that may be integrated by VCO 24 to produce a phase shift on output signal OUT-SIGNAL. Thus, the phase of OUT-SIGNAL may be substantially aligned with, or held at a fixed phase difference with, the phase of REF-SIGNAL.

Figure 1B:
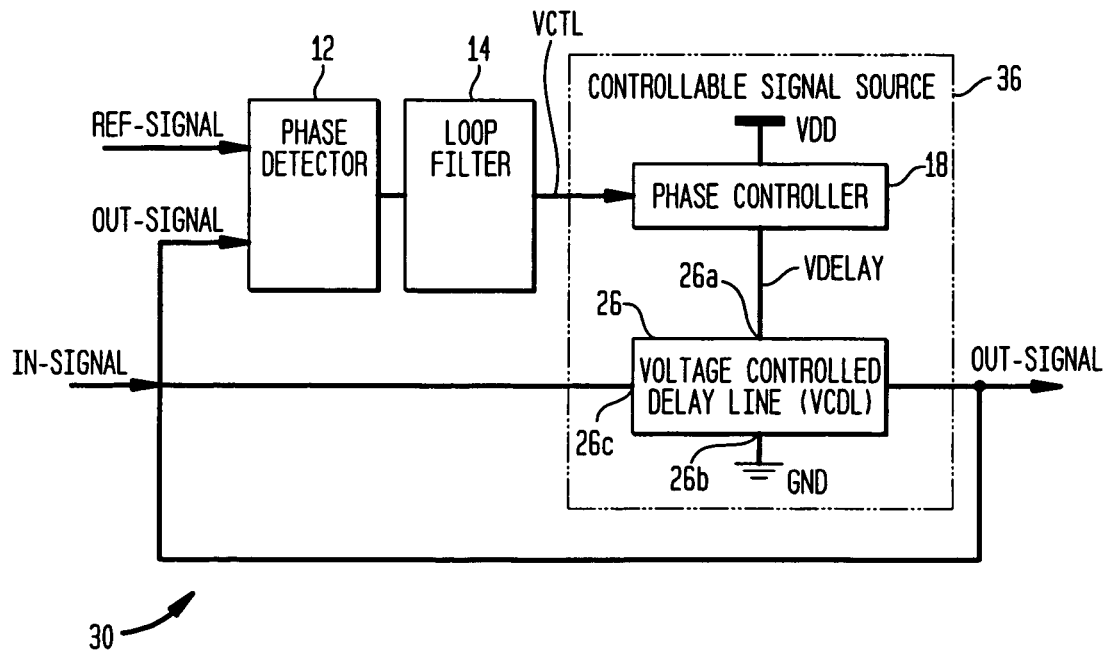
FIG. 1B is a block diagram of a delay-locked loop (DLL) according to an embodiment of the application.

Referring to FIG. 1B, shown is a block diagram of a DLL 30. The DLL 30 is a closed-loop feedback control system that generates an output signal OUT-SIGNAL and maintains the phase of that signal in a fixed relationship to the phase of a reference signal REF-SIGNAL. In DLL 30, OUT-SIGNAL may be a delayed version of an input IN-SIGNAL. The reference signal can be a data signal or a periodic clock signal having a phase and frequency. The DLL 30 includes a phase detector 12, a loop filter 14 and a controllable signal source 36 placed in a negative feedback configuration. Controllable signal source 36 is analogous to controllable signal source 16. Phase detector 12 receives REF-SIGNAL on a first input and OUT-SIGNAL on a second input. In some implementations, a divider (not shown) may be placed between OUT-SIGNAL and second input to phase detector 12, such that the frequency of OUT-SIGNAL may be a multiple K/N times the frequency of REF-SIGNAL, as described in a previous paragraph. However in such implementations REF-SIGNAL and IN-SIGNAL may need to have a fixed frequency relationship. In other implementations, REF-SIGNAL may be connected to IN-SIGNAL, and no frequency multiplication is provided. In one embodiment, the controllable signal source 36 includes a phase controller 18 similar to the phase controller 18 in PLL 10, and a signal generator 26 that outputs the OUT-SIGNAL. The signal generator 26 may include two power terminals, the voltage or current between the two power supply terminals controlling a delay of the OUT-SIGNAL with respect to IN-SIGNAL. In DLL 30, the signal generator 26 can be a voltage controlled delay line (VCDL). The VCDL 26 may be implemented in various ways. By way of example, the VCDL 26 may include a plurality of delay elements connected in series. In some implementations, the VCDL may have a first power supply terminal 26a and a second power supply terminal 26b, a signal input 26c, and a separate delay control input. In the embodiment shown in FIG. 1B, the first power supply terminal 26a also serves as the delay control input and is coupled to receive a signal VDELAY from the phase controller 18, which is coupled to a positive common supply VDD, and the second power supply terminal 26b is connected to a negative common supply GND. These connections are illustrative only; for example, the common power supply terminal might be the most positive voltage presented by the power supply.

Still referring to FIG. 1B, the controllable signal source 36 generates the output signal OUT-SIGNAL which is controlled to have the same phase as the reference signal REF-SIGNAL. DLL 30 operates such that if there is a difference in phase between output signal OUT-SIGNAL and the reference signal REF-SIGNAL, the phase detector 12 detects this difference and introduces via the loop filter 14 a change in a control signal VCTL that is proportional to the difference in phase. Phase controller 18 responds to the changes in the control signal VCTL and produces proportional changes in the VDELAY signal, which is sent to the control input 26a of VCDL 26 to adjust the delay of VCDL 26. The loop filter 14 may include low-pass elements, which filter the output of phase detector 12 to produce VCTL by removing high-frequency variations. Proportional changes on control signal VCTL cause VCDL 26 to introduce delay shifts on output signal OUT-SIGNAL with respect to IN-SIGNAL so as to maintain a fixed phase relationship between OUT-SIGNAL and REF-SIGNAL. Thus, by varying the voltage on VDELAY, which controls the delay through VCDL 26, the phase between OUT-SIGNAL and IN-SIGNAL may be varied.

In the embodiments shown in FIG. 1A and FIG. 1B, noise on the power supply VDD, that is, variation in the voltage between VDD and GND may cause VADJUST or VDELAY to vary, thus causing undesirable variations in the phase of OUT-SIGNAL, or jitter in OUT-SIGNAL. Therefore, in either PLL 10 or DLL 30, the phase controller 18 is designed to reject power supply noise, preventing changes in voltage on the VDD power supply from effecting changes in VADJUST in PLL 10 or in VDELAY in DLL 30.

Figure 2:
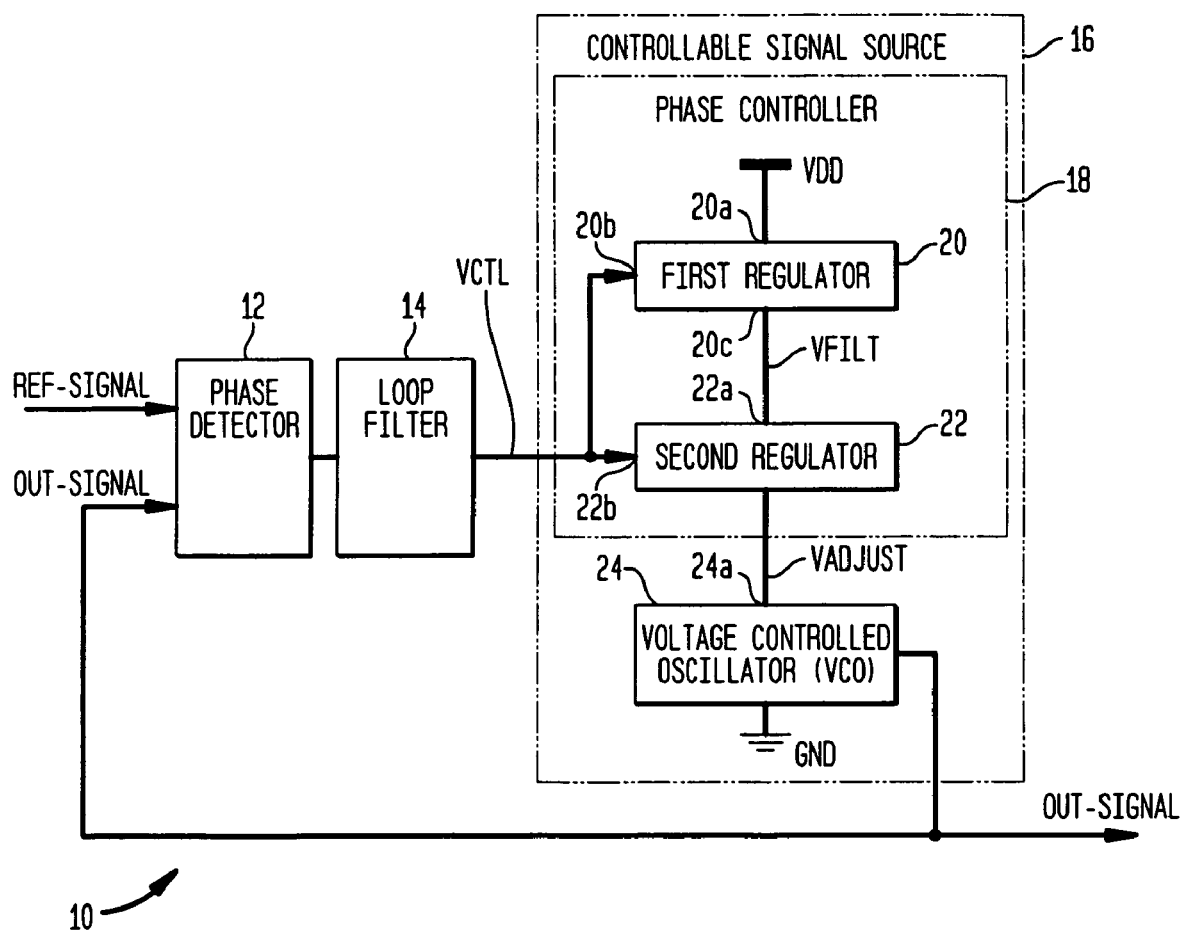
FIG. 2 is a block diagram of a PLL having a controllable signal source according to an embodiment of the application.

FIG. 2 illustrates PLL 10 according to an embodiment of the present application, in which the phase controller 18 is shown to include a first regulator 20 to provide power supply noise rejection and a second regulator 22 to provide frequency control of VCO 24. The first regulator 20 is coupled between a power supply VDD and the second regulator 22. The first regulator 20 has a first terminal 20a connected to the power supply VDD, a second terminal 20b to receive the control voltage VCTL, and a regulated power supply terminal 20c to provide a regulated power supply VFILT for the second regulator 22. As discussed in the following, the first regulator 20 may be configured as a series element, a shunt element, or a combination of series/shunt elements, and is part of a first control loop to provide power supply noise rejection by filtering power supply noise away from the VCO 24, so as to reduce errors such as phase jitter. Note that the naming of first and second regulators is completely arbitrary and has no connection with any order of operation or importance. In other words, regulator 22 may be called first regulator and regulator 20 may be called second regulator.

Still referring to FIG. 2, the second regulator 22 is coupled to the first regulator 20 and the VCO 24 and has an input terminal 22a for receiving the control voltage VCTL. As discussed in the following, the second regulator 22 may use series control elements, shunt control elements, or a combination of series/shunt elements, and may be part of a second control loop or a PLL control loop for providing phase and frequency control of the VCO 24. For example, the second regulator 22 generates a frequency adjust control signal VADJUST, which is based on the control voltage input VCTL, to the input of the VCO 24 to adjust the frequency and thus the phase of the output signal OUT-SIGNAL so that it has a substantially fixed phase relationship with the reference signal REF-SIGNAL. Thus, the phase controller 18 provides separate regulators for frequency control and for power supply noise rejection, which allows for separate design and optimization of these functions.

Figure 3:
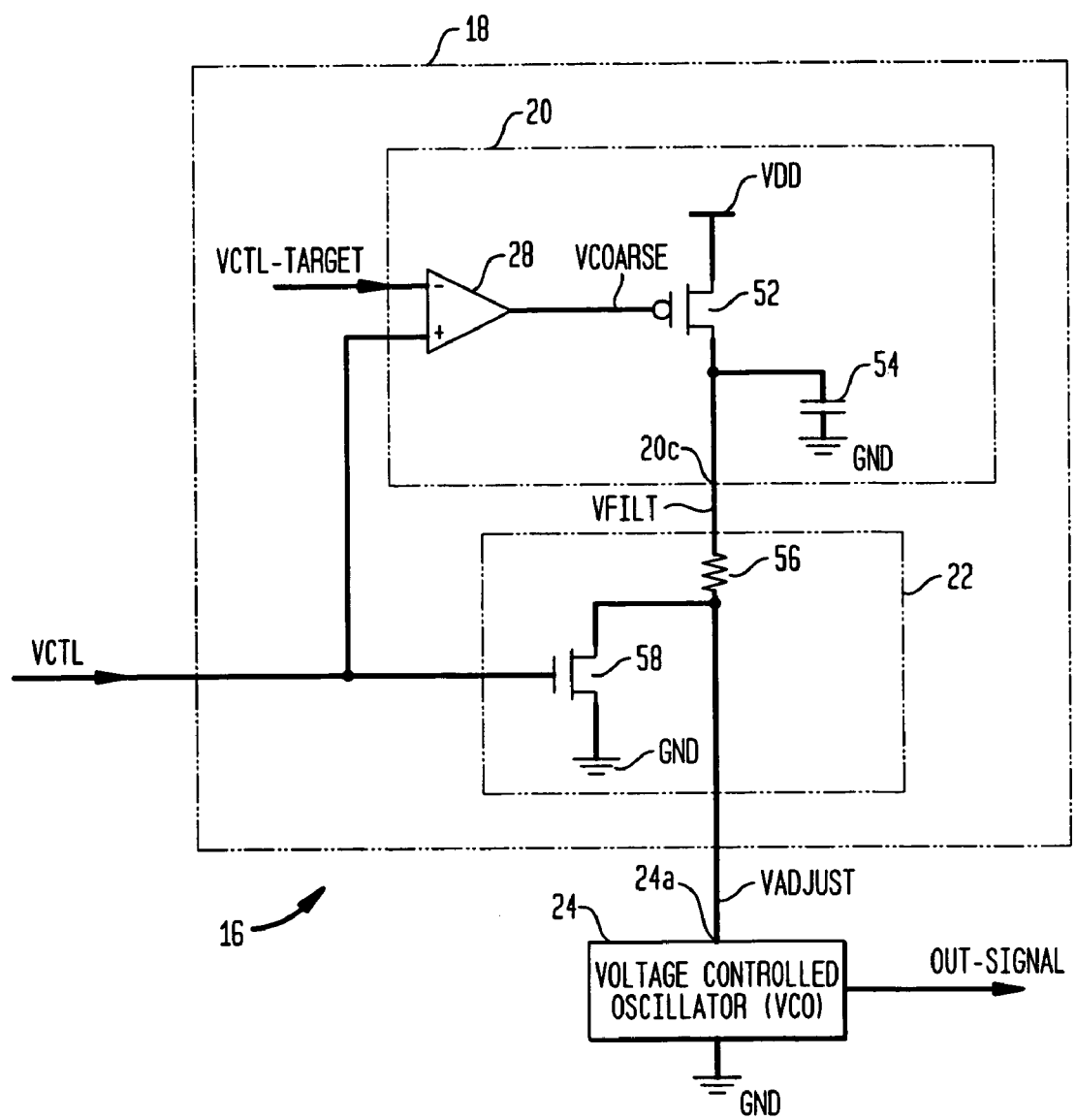
FIG. 3 is a circuit diagram of the controllable signal source of FIG. 2 according to an embodiment of the application.

Referring to FIG. 3, shown is a circuit diagram of the controllable signal source 16, which includes the phase controller 18 of FIG. 2 according to one embodiment. As shown in FIG. 3, the first regulator 20 comprises a first transistor 52 and a differential amplifier 28. The first transistor 52 is arranged in a series configuration with its source terminal coupled to the power supply VDD and its drain terminal coupled to the regulated power supply terminal 20c, which provides the regulated power supply VFILT. Alternatively, the first transistor 52 can be arranged in a shunt configuration in combination with other circuit elements, or be replaced by a combination of series and shunt elements. A filter capacitor 54 is coupled across the regulated terminal VFILT and the ground terminal GND. The gate of the first transistor 52 is driven by VCOARSE, which is the output of the differential amplifier 28. The amplifier 28 has an inverting (negative) input terminal coupled to a target control voltage VCTL-TARGET and a non-inverting (positive) input terminal coupled to control voltage VCTL. The first regulator 20 has a low pass transfer function determined mainly by the drain terminal impedance of the first transistor 52 and the capacitance of the filter capacitor 54. In an embodiment, the value of the filter capacitor 54 is about 100 pF and the drain terminal impedance of the first transistor is about 1000 ohms to provide a frequency cutoff of about 2 MHz. The low pass filter function provides power supply noise rejection by filtering out noise including variations in the power supply away from the VCO 24 and to the ground terminal GND. The first regulator 20 provides a regulated power supply VFILT at the regulated power supply terminal 20c, which is isolated from other circuits. In an embodiment in which the bandwidth of regulator 20 is about 2 MHz, the bandwidth of the PLL is about 100 MHz, so that the bandwidth of regulator 20 is nearly two orders of magnitude below that of the PLL. The bandwidth or operation speed of the regulator 20 relates to how quickly the regulator 20 reacts to a change in the power supply. The bandwidth or operation speed of the PLL 10 relates to how quickly the PLL locks the OUT-SIGNAL onto the REF-SIGNAL and reacts to any changes in the OUT-SIGNAL. Any residual power supply noise that passes from VDD to VFILT at frequencies below the bandwidth of regulator 20 should therefore be effectively removed by the PLL control loop.

Still referring to FIG. 3, the phase controller 18 and the other components of the PLL 30 discussed above may be integrated within a monolithic semiconductor chip, which typically includes other components. For example, in many semiconductor chips, the output signal OUT-SIGNAL from the controllable signal source 16 is used either directly or after further processing as a clock signal for controlling other components of the chip. In one arrangement, the reference signal REF-SIGNAL is a serial data signal from another circuit within the chip or external to the chip, and the output signal is used as a clock signal for controlling a sampling device and deserializer for recovering information from the serial data signal. The sampling device and deserializer are integrated within the chip along with other circuits which utilize the recovered data. Merely by way of example, such an arrangement can be used in memory chips, where the other circuits include the memory cells as well as circuits for writing data into and reading data out of the memory cells. The other circuits tend to introduce noise into the power supply voltage VDD. However, the power supply noise rejection capability afforded by the first regulator 20 effectively reduces the influence of the noise on the operation of the PLL.

In an embodiment, the first transistor 52 can be a p-type metal oxide semiconductor (PMOS) transistor but any controllable or variable impedance in place of or in addition to the transistor 52 can be used. In an embodiment implemented in a 90 nanometer complementary metal oxide semiconductor (CMOS) fabrication process, the size of the first transistor 52 can be about 10-20 microns wide and 100 nanometers long. The first regulator 20 is a part of the first control loop that controls the operating point of the transistor 52 and forces (drives) the control voltage VCTL toward the target value VCTL-TARGET. In an embodiment, the bandwidth of this control loop can be made relatively low such as 2 MHz. Since the first regulator 20 does not directly affect the loop dynamics of the PLL, the filter capacitor 54 can be relatively large, independent of the bandwidth of the PLL. In an embodiment, the gate capacitance of the transistor 52 can be relatively small so that the amplifier 28 for driving the first transistor 52 can be low bandwidth and low power. In an embodiment in which the bandwidth of regulator 20 is about 2 MHz, the bandwidth of amplifier 28 may be 20 MHz and amplifier 28 may consume 100 microwatts. Thus, the first regulator 20 can provide a relatively high power supply rejection ratio (PSRR) without requiring a high performance (high bandwidth and high power) amplifier for driving the first transistor 52.

In an embodiment, the second regulator 22 comprises a second transistor 58 coupled to the control input 24a of the VCO 24 in a shunt configuration with its source terminal connected to the ground terminal GND and its drain terminal connected to the control input 24a. Alternatively, the second transistor 58 can be arranged in a series configuration, or be replaced by plural transistors in a series/shunt combination. A resistor 56 is coupled in series between the control input 24a of the VCO 24 and the drain terminal of the first transistor 52. The gate terminal of the second transistor 58 is configured to receive the control signal VCTL. In an embodiment, the second transistor 58 can be an n-type MOS (NMOS) transistor but any controllable or variable impedance device can be used. The physical size of the second transistor 58 can be relatively small so that its gate and drain capacitances have negligible effects on the PLL control loop dynamics. In an embodiment in a 90 nanometer, CMOS fabrication process, the size of the second transistor 58 can be about 2 microns wide by 0.5 microns long The physical sizes of the series resistor 56, first transistor 52, filter capacitor 54, and second transistor 58 are parameters that can be varied to achieve a desired optimum solution. For example, the size of the series resistor 56 can be increased while the size of the second transistor 58 can be decreased to provide a larger range in the phase adjust signal VADJUST. The size of the first transistor 52 need only be large enough to regulate the voltage at the regulated power supply terminal VFILT over a range of power supply VDD variations processed by the first regulator 20. Accordingly, the gain of the regulated signal source 16, from VCTL voltage input to OUT-SIGNAL phase output, can be made relatively small, which can help guarantee PLL loop stability while using only relatively small capacitors in loop filter 14, thus allowing a more compact implementation of loop filter 14 on-chip.

The PLL shown in FIG. 2 can be used to illustrate the operation of the first regulator 20 and second regulator 22 shown in FIGS. 2 and 3. Assuming that power supply noise occurs due to, for example, a variation in the power supply voltage VDD such as a decrease in the voltage from the power supply between VDD and GND, in response to such a decrease, both the regulated voltage VFILT and the phase adjust signal VADJUST decrease, which causes the VCO 24 to slow down and increase the phase of the output signal OUT-SIGNAL compared to the reference signal REF-SIGNAL. The increase in phase of the output signal OUT-SIGNAL causes the phase detector 14 (FIG. 2) to decrease the control signal VCTL. The decrease in the control signal VCTL decreases the current through transistor 58 and thereby increases the voltage VADJUST which, in turn causes an increase in the speed of the VCO 24 and a corresponding decrease in the phase of OUT-SIGNAL. At the same time, the first regulator 20 reacts to the decrease in control signal VCTL by decreasing VCOARSE which, in turn causes more current to flow through transistor 52, increasing the voltage on VFILT, and eventually allowing VCTL to return toward its original value. Since first regulator 20 operates at a much lower speed than second regulator 22, it tends to hold the voltage on VCTL at the voltage of VCTL-TARGET, averaged over a time that is long compared to the operation of regulator 22, and long compared to the operation speed of the PLL 10. Thus, the second regulator 22 acts within a first time period to hold the phase of output signal OUT-SIGNAL substantially equal to the phase of REF-SIGNAL, while regulator 20 acts over a second time period much longer than the first time period to hold VCTL substantially equal to VCTL-TARGET. Thus, the first regulator 20 provides power supply noise rejection while the second regulator 22 provides phase and frequency lock.

To further illustrate the operation of the first regulator 20 and the second regulator 22, it will be assumed that the phase of the output signal OUT-SIGNAL from the VCO 24 is advancing ahead (leading) that of the phase of the reference signal REF-SIGNAL. The phase detector 12 detects this phase difference and increases the control signal VCTL, which causes the second transistor 58 to conduct more current thereby increasing the current through the second transistor (i.e., shunting current away from the oscillator). This reduces the phase adjust signal VADJUST which slows the VCO 24 and thus brings the output signal OUT-SIGNAL back into phase with the reference signal REF-SIGNAL. In addition, the amplifier 28 compares the control voltage VCTL to the target control voltage VCTL-TARGET and increases output signal VCOARSE which causes the first transistor 52 to conduct less current thereby reducing the filter voltage VFILT. This decrease in filter voltage VFILT also causes the phase adjust signal VADJUST to decrease thereby slowing down the VCO 24 to make the phase of the output signal OUT-SIGNAL more nearly aligned with that of the reference signal REF-SIGNAL. As the phase of the output signal OUT-SIGNAL becomes more nearly aligned with the phase of the reference signal REF-SIGNAL, the control voltage VCTL decreases thereby driving the voltage VCTL toward the target control voltage VCTL-TARGET. Because of the low bandwidth of the first regulator 20, the second regulator 22 typically provides the predominant correction for short term variations in the phase between the output signal OUT-SIGNAL and the reference signal REF-SIGNAL.

Figure 3A:
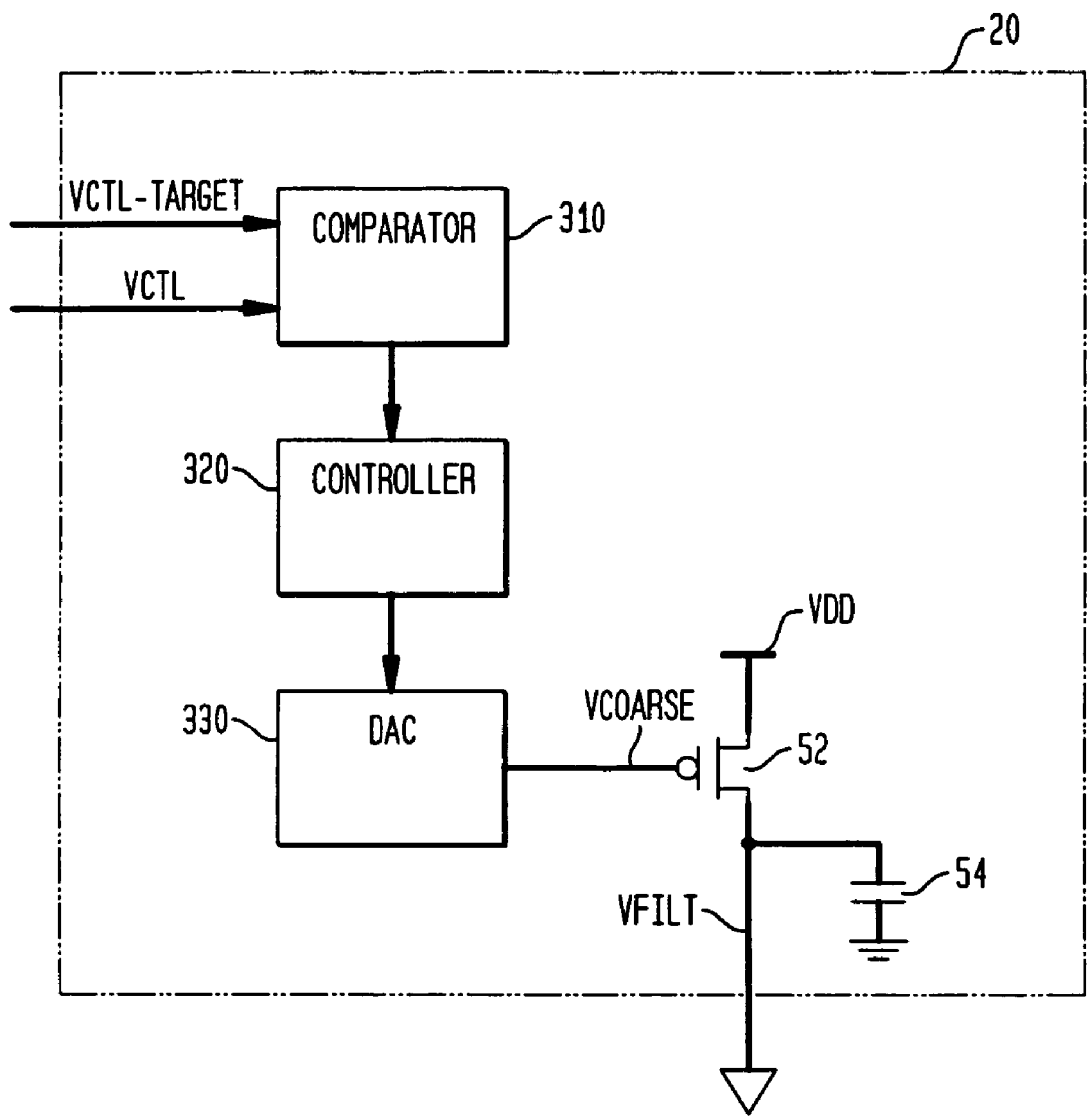
FIG. 3A is a block diagram of a first regulator in the controllable signal source of FIG. 3 according to another embodiment of the application.

In another embodiment, as shown in FIG. 3A, the first regulator 20 and associated control loop can be controlled via software using a measure-and-set technique. For example, a comparator 310 is provided to compare control voltage VCTL with target voltage VCTL-TARGET, generating a high output ("1") if the voltage on VCTL is larger than the voltage on VCTL-TARGET and a low output ("0") otherwise. A controller 320 such as a processor or micro-controller is configured with software instructions to read the output of this comparator and drive a digital code into a digital-to-analog (DAC) converter 330 that generates voltage VCOARSE to control the conduction of the transistor 52 and thereby the impedance of a path between the power supply VDD and the VFILT regulated supply voltage. The change in impedance causes a change in filter voltage VFILT which causes a change in the control voltage VADJUST that adjusts the speed of the VCO 24 and thereby the phase of the output signal OUT-SIGNAL For instance, if the control voltage VCTL is larger than the target voltage VCTL-TARGET, then the comparator outputs a high value ("1"), and the controller inputs a code to the digital-to-analog converter that generates a higher value for voltage VCOARSE which reduces the current in first transistor 52 thereby increasing the impedance of the path between VDD and VFILT. This increase in impedance causes the filtered voltage VFILT to decrease which also causes the adjustment signal VADJUST to decrease thereby decreasing the speed of the VCO 24. Conversely, if the control voltage VCTL is less than the target voltage VCTL-TARGET, then the comparator 310 generates a low value ("0") and the controller 320 inputs a digital code to the digital-to-analog converter that reduces voltage VCOARSE which increases the current in the first transistor 52, causing the voltage on both VFILT and VADJUST to increase, and thereby increases the speed of VCO 24. The controller 320 can be integrated on the same chip as the phase controller 18 or on a separate chip. In some embodiments controller 320 may be a dedicated hardware controller instead of a processor with control software.

Figure 4:
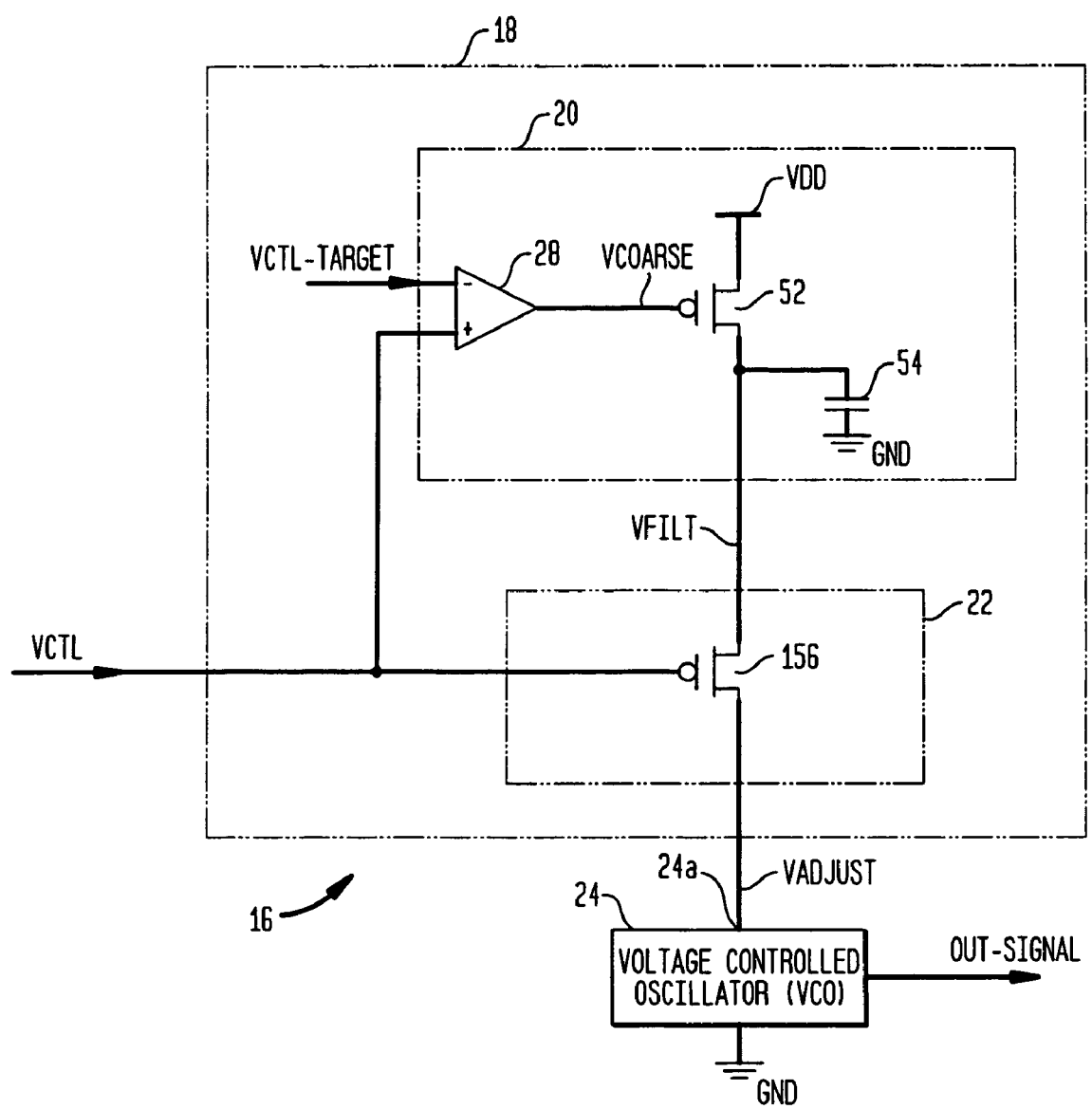
FIG. 4 is a circuit diagram of the controllable signal source of FIG. 2 according to another embodiment of the application.

Referring to FIG. 4, shown is a circuit diagram of the controllable signal source 16 according to another embodiment of the application. In the embodiment of FIG. 4, the second regulator 22 includes a transistor 156 arranged in a series configuration compared to a shunt configuration in FIG. 3. In addition, series resistor 56 is not necessary as in the second regulator 22 of FIG. 3. In this embodiment, the transistor 156 can be, for example, a PMOS transistor. The operation of the phase controller 18 in FIG. 4 is similar to that in FIG. 3 and is not repeated here.

Figure 5:
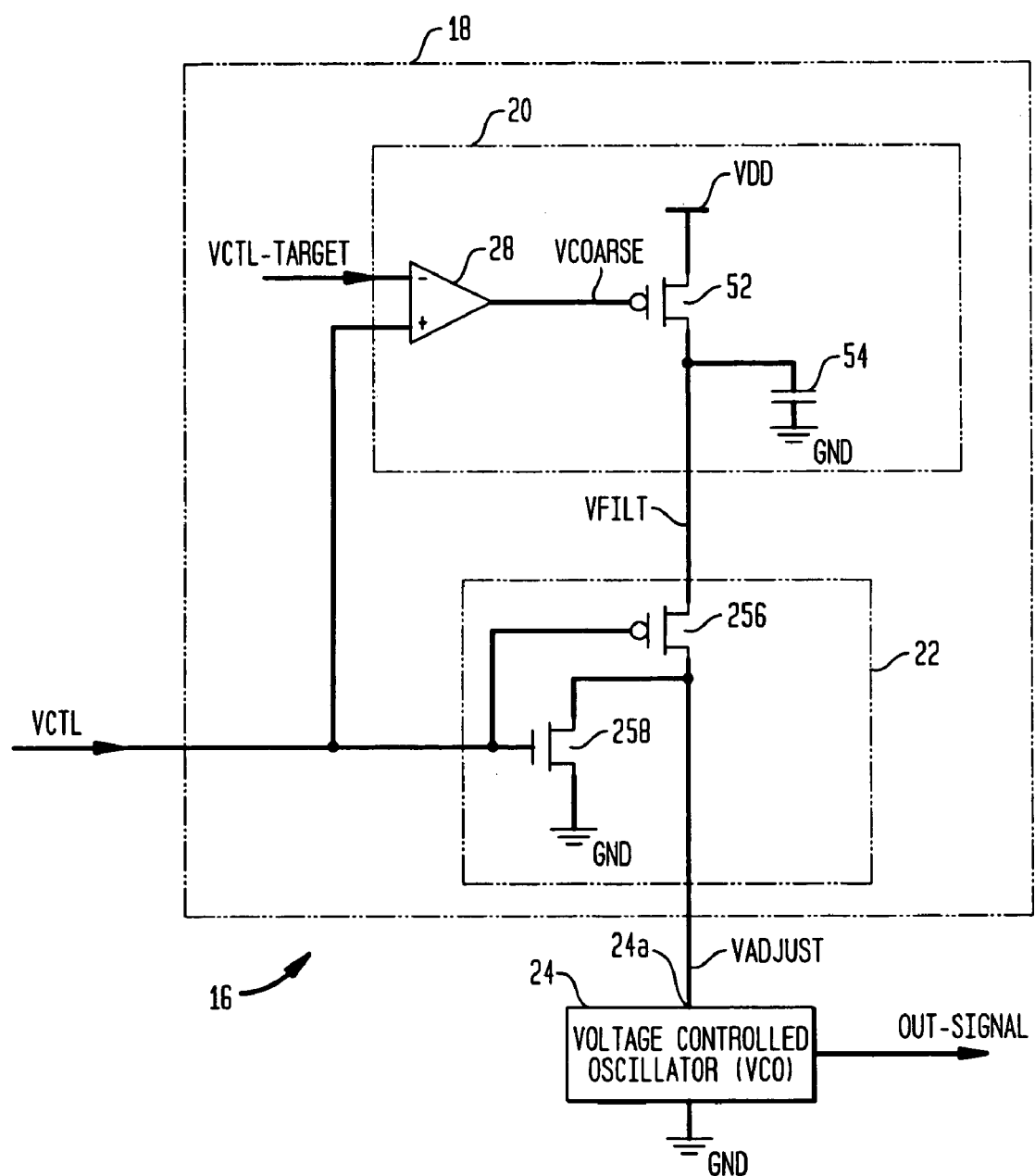
FIG. 5 is a circuit diagram of the controllable signal source of FIG. 2 according to yet another embodiment of the application.

Referring to FIG. 5, shown is a circuit diagram of the controllable signal source 16 according to yet another embodiment of the application. In this embodiment, the second regulator 22 includes a pair of transistors 256, 258 arranged in a hybrid shunt/series configuration. For example, the first transistor 256 is coupled in series between the filtered supply voltage VFILT and the VADJUST input to the VCO 24. The second transistor 258 is coupled in a shunt configuration across VCO 24. The gate terminals of the transistors 256, 258 are coupled to each other and to the control voltage VCTL. In this embodiment, for example, the first transistor 256 can be a PMOS transistor and the second transistor 258 can be an NMOS transistor. The operation of the phase controller 18 in FIG. 5 is similar to the operation of the phase controller 18 of FIG. 3 and is not repeated here.

Figure 6:
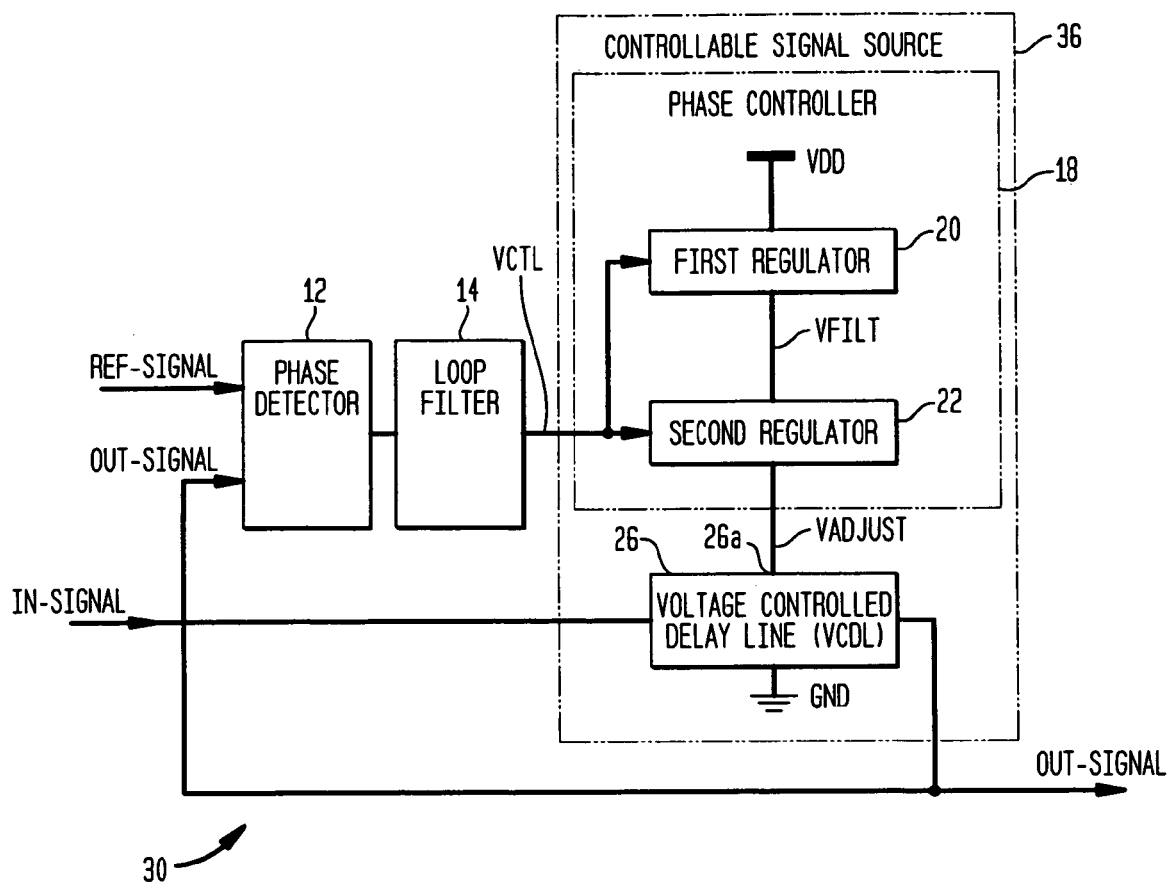
FIG. 6 is a block diagram of a DLL having a phase controller according to an embodiment of the application.

FIG. 6 shows a block diagram of the delay-locked loop (DLL) 30 in accordance with a further embodiment. The phase controller 18 in the DLL 30 may be, for example, the same or similarly configured as the phase controllers discussed above with reference to FIGS. 2-5. However, the signal supplied by the second regulator 22 is applied to the VCDL 26 rather than to the VCO 24, and accordingly is labeled "VDELAY".

The VCDL 26 generates output signal OUT-SIGNAL which is a delayed version of the reference signal IN-SIGNAL. By varying the amount of delay applied, VCDL 26 can vary the phase of output signal OUT-SIGNAL with respect to IN-SIGNAL. Merely by way of example, arrangements using delay elements can be used where an externally-generated signal is available. For example, in a chip which receives numerous different externally-generated data signals, a single DLL may be used to generate a clock signal which is supplied as the input signal IN-SIGNAL to several DLL circuits of the type shown in FIG. 6, each of which uses a different one of the data signals as a reference signal REF-SIGNAL. In other embodiments, IN-SIGNAL may be replaced with a connection to REF-SIGNAL, so that REF-SIGNAL is applied both to the phase detector 12 and to the signal input of VCDL 26.

The operation of the phase controller 18 is similar to that of the phase controller of FIG. 3 and is not repeated.

In the embodiments of FIGS. 2-6, the first regulator 20 compares the loop control voltage VCTL with a target voltage VCTL-TARGET. VCTL-TARGET is chosen in such a way as to optimize the performance of second regulator 22, for example, by forcing regulator 22 to operate in its high-gain region of operation. VCTL-TARGET may be generated in various ways, for example by building a replica of regulator 22 that is forced to operate at the desired operating point and extracting the resulting VCTL-TARGET voltage from the replica. Alternatively, and merely by way of illustrative example, VCTL-TARGET may be generated by an on-chip or off-chip reference source or in a digitally controlled signal source.

In the embodiments of FIGS. 2-6, the first regulator 20 compares the loop control voltage VCTL with a target voltage VCTL-TARGET to determine the control signal VCOARSE applied to the transistor 52 of the first regulator.

Figure 7:
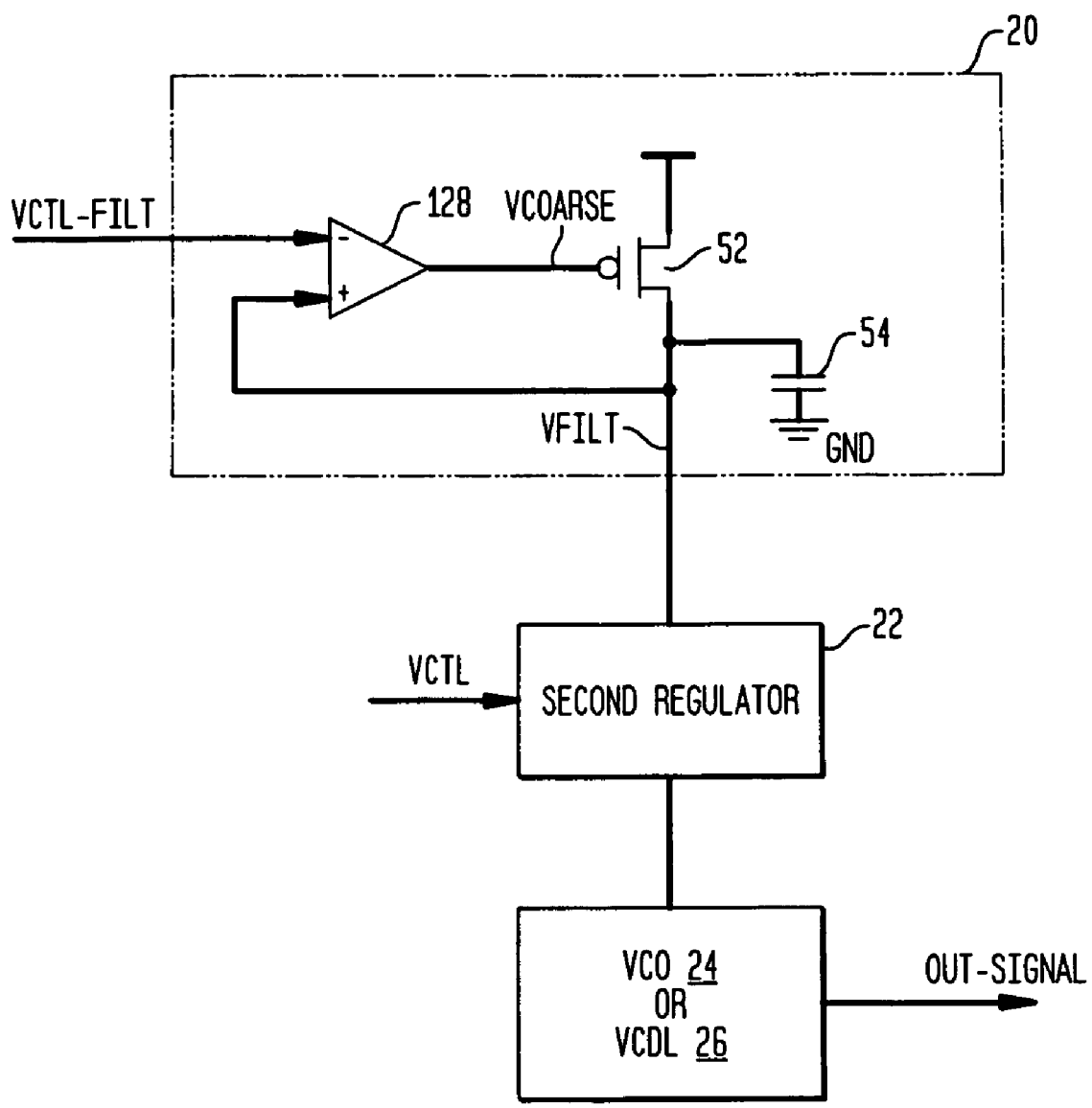
FIG. 7 is a block diagram of a PLL or DLL having a first regulator according to another embodiment of the application.

In a further embodiment, shown in FIG. 7, the regulated power supply voltage VFILT supplied by the first regulator 20 is fed back to one input terminal of a differential amplifier 128 and a target voltage VCTL-FILT is applied to the opposite input terminal of the differential amplifier. The output of the differential amplifier 128, representing deviation of the regulated power supply voltage VFILT from the target VCTL-FILT, is coupled to the gate of the transistor 52 of the first regulator 20. The control signal VCTL representing phase difference is not fed back to the first regulator 20. In other respects, the phase controller 18 in FIG. 7 and other aspects of the circuit shown in FIG. 7 may be identical or similar to those discussed above. In the embodiment shown in FIG. 7, however, the first regulator 20 does not vary VFILT to compensate for changes in the phase difference; the second regulator 22 is responsive to the phase difference. Still, the first regulator 20 rejects power supply noise.

The particular embodiments shown above are merely illustrative. For example, the power supply connections of the phase controller and VCO of FIG. 2 could be reversed, such that the common supply terminal is the more positive supply. Generally the implementations of first regulator 20 and second regulator 22 in FIGS. 2-7 could be modified by replacing NMOS transistors with PMOS transistors, and vice-versa. The embodiments of FIGS. 2-7 could also be implemented in alternative technologies, for example replacing metal-oxide field-effect transistors with bipolar transistors of suitable polarity.

Although the application herein has been described with reference to particular embodiments, it is to be understood that these embodiments are merely illustrative of the principles and applications of the present application. It is therefore to be understood that numerous modifications may be made to the illustrative embodiments and that other arrangements may be devised without departing from the spirit and scope of the present invention as defined by the appended claims.

The invention claimed is:

1. A phase control circuit comprising:
a signal generator to generate an output signal having a signal parameter that is dependent on at least one of a current and a voltage across the signal generator, the signal parameter being selected from the group consisting of frequency, phase and delay with respect to an input signal;
a first regulator having a first terminal for coupling to a power supply, a second terminal to receive a first control signal, a third terminal to receive a target signal, and a regulated supply terminal to provide a regulated power supply based at least in part on comparison of the first control signal with the target signal; and
a second regulator coupled to the regulated supply terminal, the second regulator to receive a second control signal and to output an adjust signal based at least in part on the second control signal, the adjust signal adjusting at least one of the current and the voltage across the signal generator.

2. The circuit of claim 1, wherein the first regulator includes a low pass filter to filter out power supply noise including variations in a voltage between the first and second power supply terminals.

3. The circuit of claim 1, wherein the first regulator includes a transistor coupled between the first power supply terminal and the regulated supply terminal and a capacitor coupled across the regulated supply terminal and the second power supply terminal.

4. The circuit of claim 1, wherein the first control signal is the same as the second control signal.

5. The circuit of claim 1, wherein the first control signal is the same as the regulated power supply.

6. The circuit of claim 1, wherein the second regulator includes a transistor coupled to the signal generator in a shunt configuration and a resistor coupled to the signal generator in a series configuration.

7. The circuit of claim 1, wherein the second regulator includes a transistor coupled in series between the regulated supply terminal and the signal generator.

8. The circuit of claim 1, wherein the second regulator includes a combination of shunt and series elements.

9. The circuit of claim 1, wherein the signal generator is selected from the group consisting of a voltage controlled oscillator and a voltage controlled delay line.

10. The circuit of claim 1, further comprising a phase detector coupled to the input of the second regulator to generate the second control signal based on a phase difference between a reference signal and the output signal.

11. The circuit of claim 10, further comprising a loop filter coupled between the phase detector and the second regulator to modify spectral characteristics of the second control signal to assure closed-loop stability in the phase control circuit.

12. An information-bearing medium having computer-readable information thereon, the computer-readable information being configured to actuate a circuit-forming apparatus to form a cell of an integrated circuit including a phase control circuit of claim 1.

13. A method of phase control comprising:
generating an output signal having a phase;
receiving a control signal based at least in part on a phase difference between the output signal and a reference signal;
generating a regulated power supply based at least in part on comparison between the control signal and a target signal;
generating an adjust signal according to the control signal and the regulated power supply; and
adjusting the frequency of the output signal or the delay of the output signal with respect to an input signal phase of the output signal in accordance with the adjust signal.

14. The method of claim 13, further comprising spectrally filtering the control signal.

15. A phase control circuit, comprising:
first and second power supply terminals;
first and second circuit nodes;
a signal generator between the second circuit node and the second power supply terminal, the signal generator to produce an output signal having a signal parameter that is dependent on a phase adjust voltage at the second circuit node, the signal parameter being selected from the group consisting of frequency, phase and delay with respect to an input signal;
a first, regulator coupled between the first power supply terminal and the first circuit node, the first regulator to filter noise in a power supply voltage between the first and second power supply terminals away from the signal generator; and
a second regulator coupled between the first and second circuit nodes, the second regulator to adjust the phase adjust voltage in response to a control signal, the control signal being dependent on a phase difference between the output signal and a reference signal.

16. The phase control circuit of claim 15, wherein the first regulator is to change an impedance of a circuit path between the first power supply and the first circuit node in response to a change in the power supply voltage.

17. The phase control circuit of claim 16, wherein the first regulator is to generate a signal to control the impedance based on a comparison of an input signal with a target voltage, the input signal being one of the control signal and a regulated supply voltage at the first circuit node.

18. The phase control circuit of claim 16, wherein the first regulator is to hold an average of the control signal close to a target value.

19. The phase control circuit of claim 15, wherein a bandwidth of the first regulator is about two orders of magnitude below that of the phase control circuit.

20. A method of phase control, comprising:
generating a phase adjust signal in response to a control signal;
producing an output signal having a signal parameter dependent on the phase adjust signal, the signal parameter being selected from the group consisting of frequency, phase and delay with respect to an input signal;
generating the control signal based at least in part on a phase difference between the output signal and a reference signal; and
holding an average of the control signal close to a target value to filter out noise in a power supply voltage, wherein the holding step includes controlling an impedance based on a comparison of the control signal with the target value.

21. A phase control circuit comprising:

a signal generator to generate an output signal having a phase;

a first regulator to generate a phase adjust signal in response to a control signal, the control signal being dependent on a phase difference between the output signal and a reference signal, the phase adjust signal controlling the phase of the output signal; and a second regulator to hold an average of the control signal close to a target value by controlling an impedance based on a comparison of the control signal with the target value.

* * * * *